United States Patent
Yen (10) Patent No.: US 10,748,985 B2
(45) Date of Patent: Aug. 18, 2020

(54) INTEGRATED INDUCTOR APPARATUS

(71) Applicant: Realtek Semiconductor Corporation, Hsinchu (TW)

(72) Inventor: Hsiao-Tsung Yen, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/129,861

(22) Filed: Sep. 13, 2018

(65) Prior Publication Data
US 2019/0088734 A1 Mar. 21, 2019

(30) Foreign Application Priority Data
Sep. 20, 2017 (TW) .............................. 106132291 A (51) Int. Cl.
| | | |
|---|---|---|
| *H01L 49/02* | (2006.01) | |
| *H01L 23/522* | (2006.01) | |
| *H01F 27/29* | (2006.01) | |
| *H01F 5/04* | (2006.01) | |
| *H01F 17/00* | (2006.01) | |

(52) U.S. Cl.
CPC .............. *H01L 28/10* (2013.01); *H01F 5/04* (2013.01); *H01F 17/0013* (2013.01); *H01F 27/29* (2013.01); *H01L 23/5227* (2013.01)

(58) Field of Classification Search
CPC . H01L 28/10; H01L 23/5227; H01F 17/0013; H01F 27/29; H01F 5/04
See application file for complete search history.

(56) References Cited

U.S. PATENT DOCUMENTS

| | | | | |
|---|---|---|---|---|
| 7,486,167 B2* | 2/2009 | Loke | ................... | H01L 23/5227 336/200 |
| 8,319,577 B2* | 11/2012 | Endo | ................... | H01F 17/0013 333/238 |
| 2015/0170824 A1* | 6/2015 | Tesson | ................ | H01F 27/2804 336/190 |
| 2015/0364242 A1* | 12/2015 | Aboush | ................... | H03L 7/099 336/192 |
| 2015/0364243 A1 | 12/2015 | Yen et al. | | |
| 2017/0012601 A1* | 1/2017 | Yen | ......................... | H03H 7/42 |
| 2018/0040413 A1* | 2/2018 | Yen | ..................... | H01F 27/2804 |

FOREIGN PATENT DOCUMENTS

| | | |
|---|---|---|
| CN | 1921035 A | 2/2007 |
| TW | I553679 B | 10/2016 |

* cited by examiner

*Primary Examiner* — Yasser A Abdelaziez
(74) *Attorney, Agent, or Firm* — Locke Lord LLP; Tim Tingkang Xia, Esq.

(57) ABSTRACT

An integrated inductor includes a first coil, a second coil, a third coil and a fourth coil. The first coil is disposed on a first layer of an integrated circuit structure. The second coil is disposed on the first layer and adjacent to the first coil, in which the first coil and the second coil have same number of turns. The third coil is disposed on a second layer of the integrated circuit structure and above the first coil. The fourth coil is disposed on the second layer and above the second coil, in which the third coil and the fourth coil have same number of turns. The first coil is coupled to and interlaced with the fourth coil disposed on the second layer. The second coil is coupled to and interlaced with the third coil disposed on the second layer.

18 Claims, 7 Drawing Sheets

INTEGRATED INDUCTOR APPARATUS

CROSS-REFERENCE TO RELATED APPLICATION

This application claims priority to Taiwan Application Serial Number 106132291, filed on Sep. 20, 2017, which is herein incorporated by reference.

BACKGROUND

Field of Invention

Present disclosure relates to an integrated circuit, especially an inductor apparatus in the integrated circuit.

Description of Related Art

Nowadays, inductor apparatuses are essential in an integrated circuit. In these inductor apparatuses, since an eight-shaped inductor has a symmetric electrical characteristic and has two terminals able to generate magnetic fields having opposite directions, the magnetic fields generated by the eight-shaped inductor are offset with each other. As such, the eight-shaped inductor introduces fewer impacts on other parts in the integrated circuit. Therefore, the eight-shaped inductor is widely applied in an integrated circuit, especially as a part of transformers. However, in current approaches, an eight-shaped inductor is difficult to be formed to have a complete symmetric electrical characteristic.

DETAILED DESCRIPTION

Figure 1:
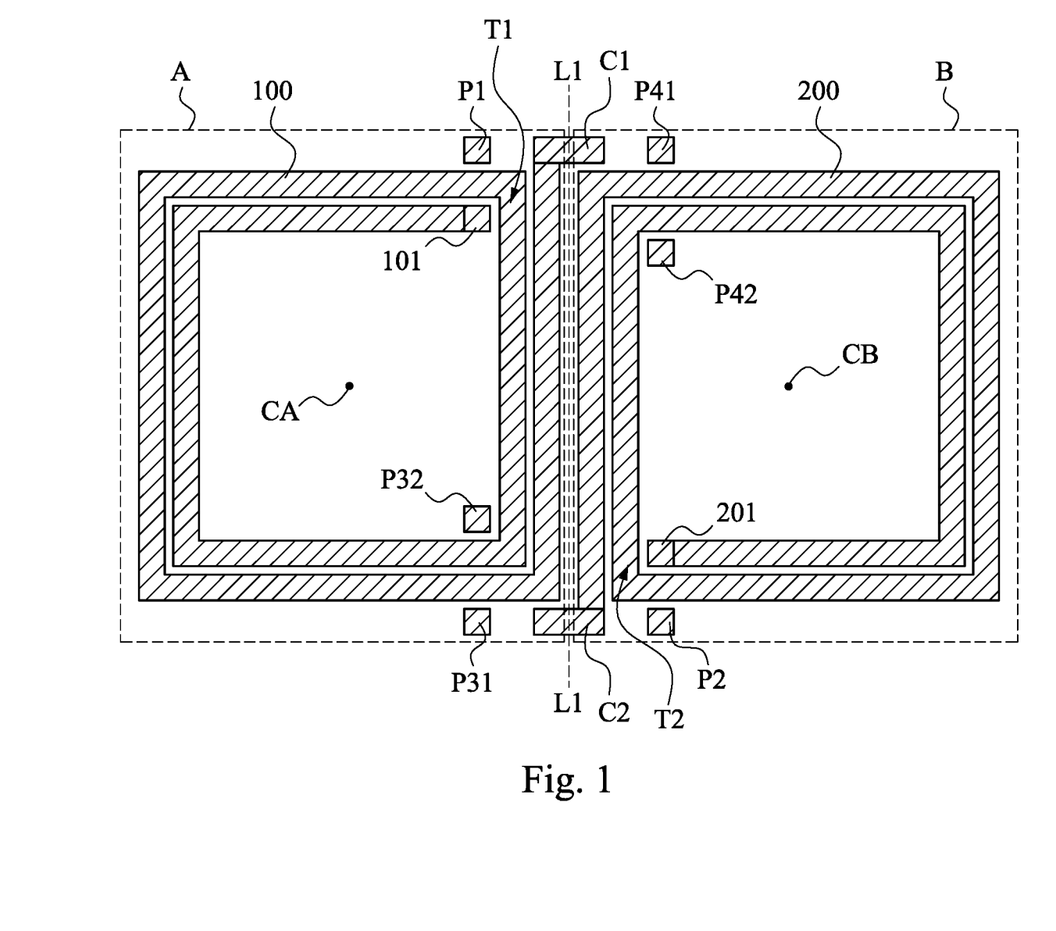
FIG. 1 is a schematic diagram of an integrated inductor apparatus according to one embodiment of present disclosure.

FIG. 1 is a schematic diagram of an integrated inductor apparatus according to one embodiment of present disclosure. In the embodiment, a first coil 100 and a second coil 200 are illustrated, and both the coils are planar coils. The first coil 100 and the second coil 200 are disposed on a first layer of an integrated circuit board (not shown). As shown in FIG. 1, a first imaginary line L1, which is extended from a first orientation of the first layer to a second orientation of the first layer, is illustrated on the first layer of the integrated circuit board. As demarcated by the first imaginary line L1, the first layer of the integrated circuit board is substantially divided into a first area A and a second area B, in which the first area A has a first center CA and the second area B has a second center CB. The first coil 100 is disposed in the first area A and substantially centered at the first center CA. The second coil 200 is disposed in the second area B and substantially centered at the second center CB.

In the embodiment, the first area A has a first side, a second side, a third side, and a fourth side. As illustrated in FIG. 1, the first side is the topside of the first area A, the second side is the downside of the first area A, the third side is the left side of the first area A, and the fourth side is the right side of the first area A. Similarly, the second area B has a first side, a second side, a third side and a fourth side as well. The arrangements of the four sides of the second area B are the same as those of the four sides of the first area A. In this case, the fourth side of the first area A is adjacent to the third side of the second area B.

In the embodiment, the first coil 100 includes two turns which are a first turn located at an inner side and a second turn located at an outer side. In the first area A, the second turn of the first coil 100 winds around the first turn of the first coil 100. The first turn of the first coil 100 has a beginning end 101. The first turn of the first coil 100 is disposed, from the beginning end 101 and the first side, the third side, the second side, and the fourth side of the first area A to a reference point T1, around the first center CA in a counterclockwise direction, and is then arranged to the second turn of the first coil 100 via the reference point T1. Metallic segments of the second turn of the first coil 100 are disposed, from the reference point T1 and the first side, the third side, the second side, and the fourth side of the first area A to a first connector C1, around the first center CA in the counterclockwise direction, and is then coupled to the first connector C1. A first port P1 is located around a top-right corner of the first area A and outside the second turn of the first coil 100. The beginning end 101 of the first coil 100 is coupled to the first port P1 through a first connecting line (not shown). The first connecting line is disposed on another layer of the integrated circuit board that is different from the first layer. The beginning end 101 of the first coil 100 is coupled to the first connecting line through a via, and the first port P1 is coupled to the first connecting line through another via. An end terminal of the first coil 100 is coupled to the first connector C1. The first connector C1 is located outside the second turn of the first coil 100 and around the top-right corner of the first area A. The first connector C1 is vertically disposed on the first layer and between the first area A and the second area B.

In the embodiment, the second coil 200 includes two turns which are a first turn located at an inner side and a second turn located at an outer side. In the second area B, the second turn of the second coil 200 winds around the first turn of the second coil 200. The first turn of the second coil 200 has a beginning end 201. The first turn of the second coil 200 is disposed, from the beginning end 201 and the second side, the fourth side, the first side, and the third side of the second area B to a reference point T2, around the second center CB in a counterclockwise direction, and is then arranged to the second turn of the second coil 200 via the reference point T2. Metallic segments of the second turn of the second coil 200 are disposed from the reference point T2 and the second side, the fourth side, the first side, and the third side of the second area B to a second connector C2, around the second center CB in a counterclockwise direction, and is then coupled to the second connector C2. A second port P2 is located around a down-left corner of the second area B and outside the second turn of the second coil 200. The beginning end 201 of the second coil 200 is coupled to the second port P2 through a second connecting line (not shown). The second connecting line is disposed on another layer of the integrated circuit board that is different from the first layer. The beginning end 201 of the second coil 200 is coupled to the second connecting line through a via, and the second port P2 is coupled to the second connecting line through another via. An end terminal of the second coil 200 is coupled to the second connector C2. The second connector C2 is located outside the second turn of the second coil 200 and around the down-left corner of the second area B. The second connector C2 is vertically disposed on the first layer and between the first area A and the second area B.

Figure 2:
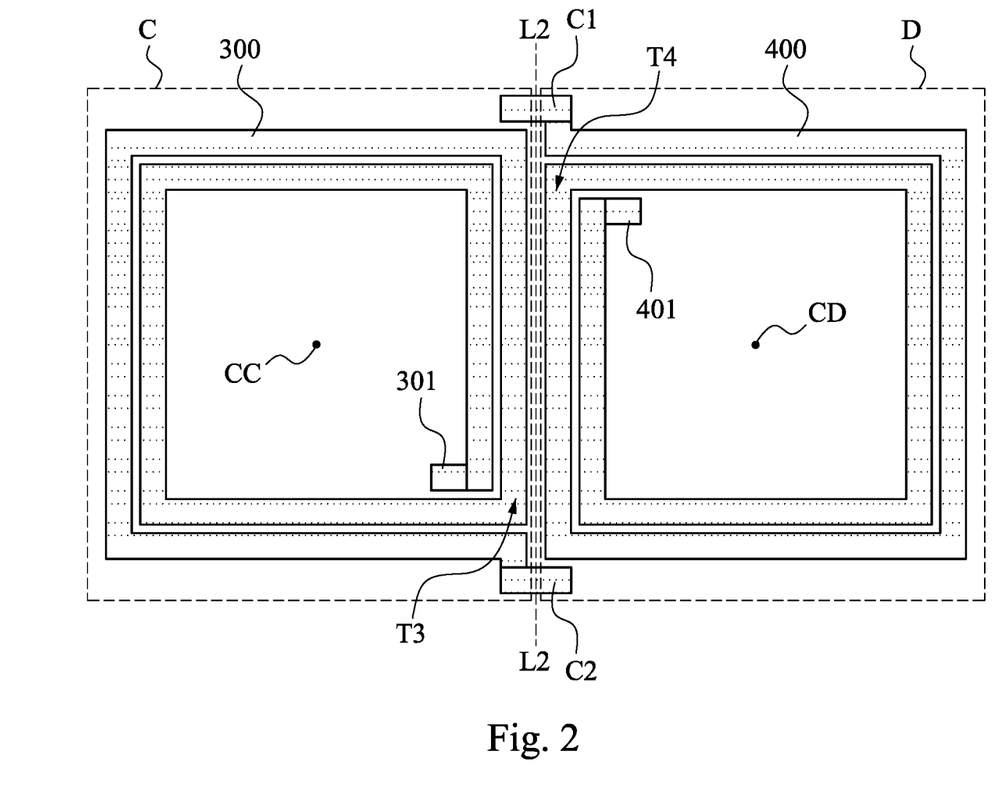
FIG. 2 is a schematic diagram of an integrated inductor apparatus according to one embodiment of present disclosure.

FIG. 2 is a schematic diagram of an integrated inductor apparatus according to one embodiment of present disclosure. In the embodiment, a third coil 300 and a fourth coil 400 are illustrated, and both the coils are planar coils. The third coil 300 and the fourth coil 400 are disposed on a second layer of the integrated circuit board, in which the second layer is disposed above the first layer. As shown in FIG. 2, a second imaginary line L2, which is extended from a first orientation of the second layer to a second orientation of the second layer, is illustrated. The second imaginary line L2 is parallel to the first imaginary line L1 in FIG. 1. As demarcated by the second imaginary line L2, the second layer of the integrated circuit board is substantially divided into a third area C and a fourth area D, in which the third area C has a third center CC and the fourth area D has a fourth center CD. The third area C is disposed above the first area A, and the fourth area D is disposed above the second area B. The third coil 300 is disposed in the third area C and substantially centered at the third center CC. The fourth coil 400 is disposed in the fourth area D and substantially centered at the fourth center CD.

In the embodiment, each of the third area C and the fourth area D has a first side, a second side, a third side, and a fourth side. The arrangements of the four sides of the third area C or the fourth area D are the same as the arrangements of the four sides of the first area A or the second area B in FIG. 1. In this case, the fourth side of the third area C is adjacent to the third side of the fourth area D.

In the embodiment, the third coil 300 includes two turns which are a first turn located at an outer side and a second turn located at an inner side. In the third area C, the second turn of the third coil 300 is disposed around the first turn of the third coil 300. The first turn of the third coil 300 has a beginning end which is coupled to the second connector C2 in FIG. 1. From the second connector C2 and the second side, the third side, the first side, and the fourth side of the third area C to a reference point T3, the first turn of the third coil 300 is disposed around the third center CC in a clockwise direction, and is then connected/mounted to the second turn of the third coil 300 via the reference point T3. Metallic segments of the second turn of the third coil 300 are disposed, from the reference point T3 and the second side, the third side, the first side, and the fourth side of the third area C to an end terminal 301, around the third center CC in the clockwise direction. The end terminal 301 is coupled to a third port P31 which is disposed on the first layer in FIG. 1. The third port P31 is located outside the second turn of the first coil 100 and around a down-right corner of the first area A. The end terminal 301 of the third coil 300 is coupled to a connecting point P32 disposed on the first layer, and the connecting point P32 is coupled to the third port P31 through a third connecting line (not shown). The third connecting line is disposed on another layer of the integrated circuit board that is different from the second layer. The end terminal 301 of the third coil 300 is coupled to the connecting point P32 through a via, and the third port P31 is coupled to the third connecting line through another via.

In the embodiment, the fourth coil 400 includes two turns which are a first turn located at an outer side and a second turn located at an inner side. In the fourth area D, the second turn of the fourth coil 400 is winds around the first turn of the fourth coil 400. The first turn of the fourth coil 400 has a beginning end, in which the beginning end is coupled to the first connector C1 shown in FIG. 1. The first turn of the fourth coil 400 is disposed, from the beginning end and the first side, the fourth side, the second side, and the third side of the fourth area D to a reference point T4, around the fourth center CD in a clockwise direction, and is then arranged to the second turn of the fourth coil 400 via the reference point T4. Metallic segments of the second turn of the fourth coil 400 are disposed, from the reference point T4, and the first side, the fourth side, the second side, and the third side of the fourth area D to an end terminal 401, around the fourth center CD in a clockwise direction, and is then coupled to a fourth port P41. The fourth port P41 is disposed on the first layer shown in FIG. 1. The fourth port P41 is located around an up-left corner of the second area B and outside the second turn of the second coil 200. The end terminal 401 of the fourth coil 400 is coupled to a connecting point P42 disposed on the first layer, and the connecting point P42 is coupled to the fourth port P41 through a fourth connecting line (not shown). The fourth connecting line is disposed on another layer of the integrated circuit board that is different from the second layer. The end terminal 401 of the fourth coil 400 is coupled to the connecting point P42 through a via, and the fourth port P41 is coupled to the fourth connecting line through another via.

Figure 3:
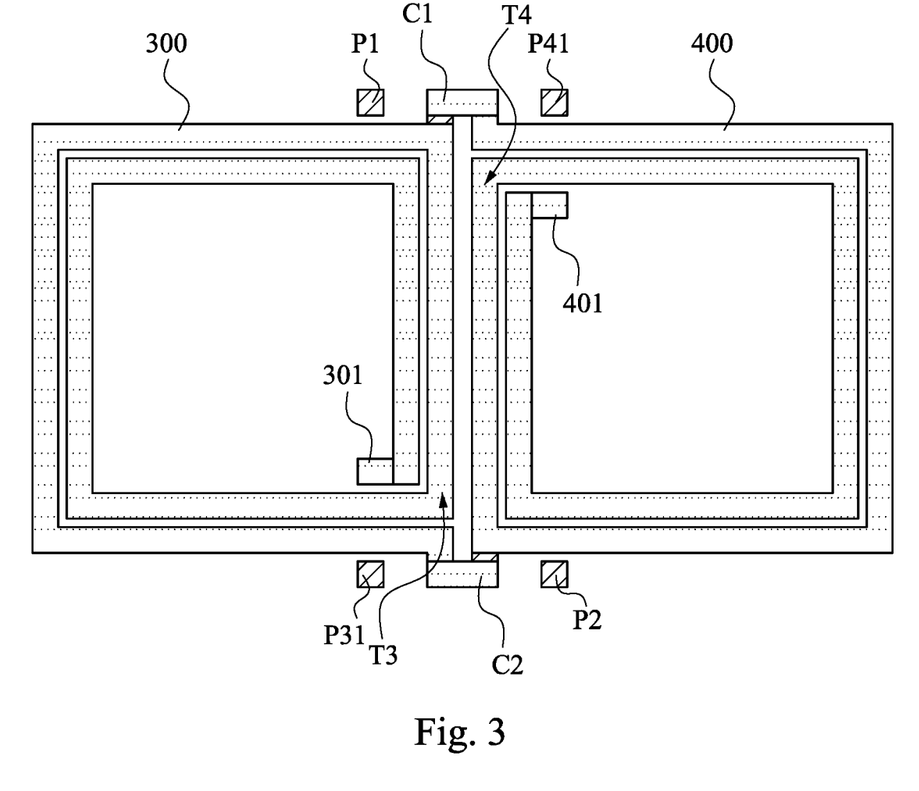
FIG. 3 is a schematic diagram of an integrated inductor apparatus according to one embodiment of present disclosure.

FIG. 3 is a schematic diagram of an integrated inductor apparatus according to one embodiment of present disclosure. The figure illustrates a stacked integrated inductor apparatus formed by the integrated inductor apparatus shown in FIG. 1 and FIG. 2. With respect to FIG. 1 and FIG. 2, like elements in FIG. 3 are designated with the same reference numbers for ease of understanding. In the embodiment, the second layer of the integrated circuit board is disposed above and in parallel with the first layer. The third area C of the second layer is disposed above the first area A of the first layer, and the fourth area D of the second layer is disposed above the second area B of the first layer. In the embodiment, as shown in FIGS. 1-2, the first coil 100 disposed on the first layer is coupled to and interleaved with the fourth coil 400 disposed on the second layer via the first connector C1, and the second coil 200 disposed on the first layer is coupled to and interleaved with the third coil 300 disposed on the second layer via the second connector C2. When being passed through by a current, the first coil 100 and the third coil 300 can generate opposite magnetic fields that are offset each other. When being passed through by a current, the second coil 200 and the fourth coil 400 can generate opposite magnetic fields that are offset each other.

Figure 4:
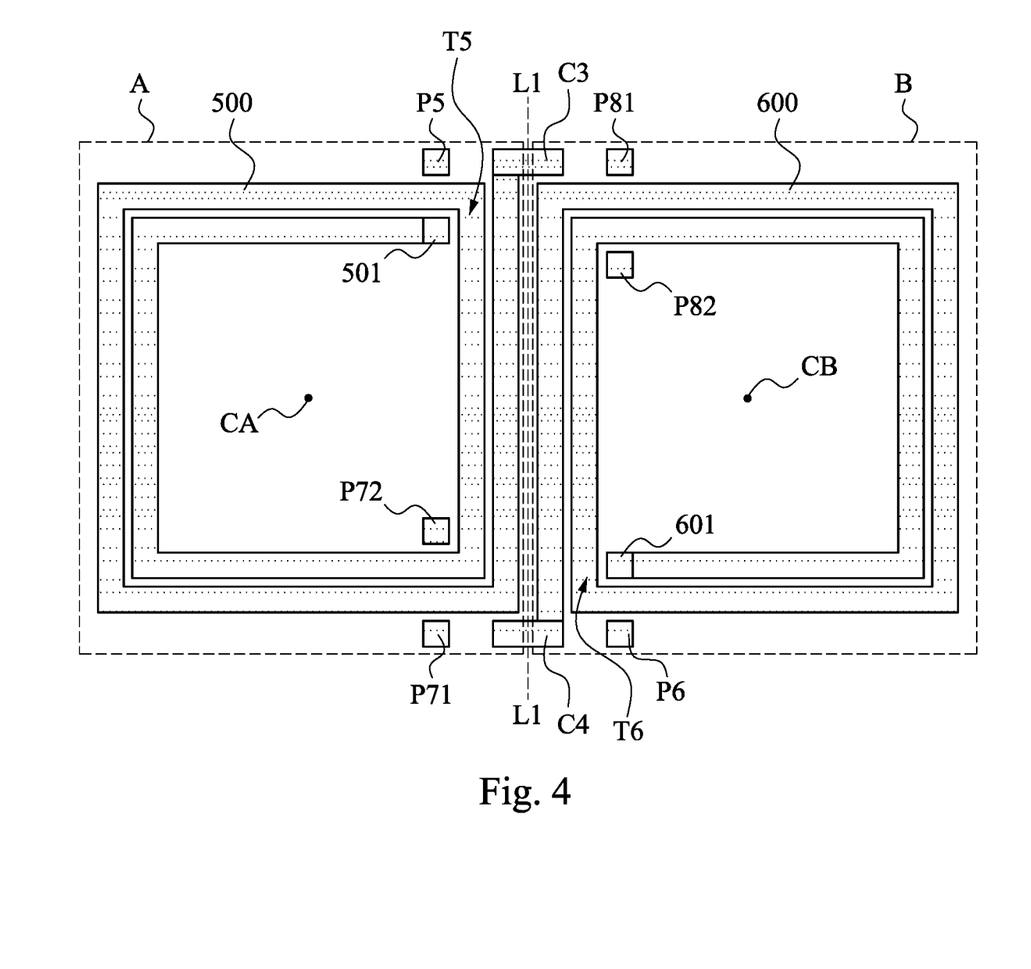
FIG. 4 is a schematic diagram of an integrated inductor apparatus according to one embodiment of present disclosure.

FIG. 4 is a schematic diagram of an integrated inductor apparatus according to one embodiment of present disclosure. In the embodiment, a first coil 500 and a second coil 600 are disposed on the first layer of the integrated circuit board. The patterns of the first coil 500 and the second coil 600 are identical to those of the first coil 100 and the second coil 200 in FIG. 1. The difference between this embodiment and the embodiment of FIG. 1 is that first coil 500 has a beginning end 501 coupling to a first port P5 and the second coil 600 has a beginning end 601 coupling to a second port P6. Moreover, the first coil 500 is coupled to a first connector C3, and the second coil 600 is coupled to a second connector C4. The location of a reference point T5 in FIG. 4 is the same as that of the reference point T1 in FIG. 1. The location of a reference point T6 in FIG. 4 is the same as that of the reference point T2 in FIG. 1.

Figure 5:
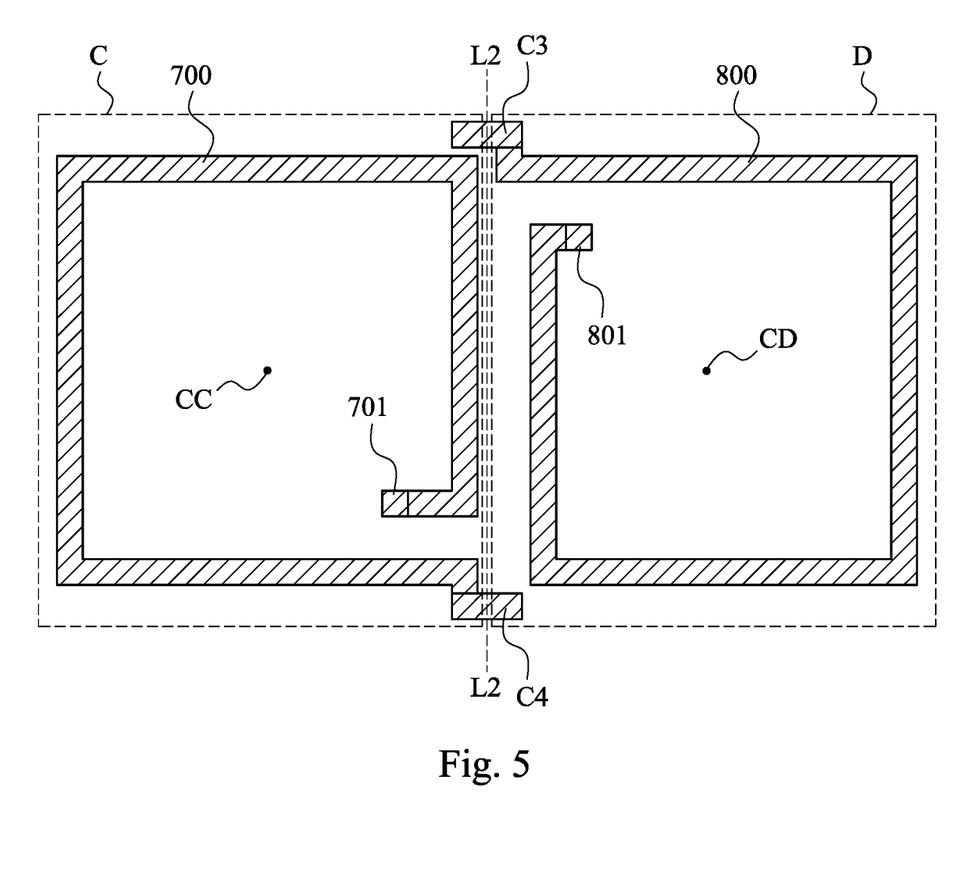
FIG. 5 is a schematic diagram of an integrated inductor apparatus according to one embodiment of present disclosure.

FIG. 5 is a schematic diagram of an integrated inductor apparatus according to one embodiment of present disclosure. In the embodiment, a third coil 700 and a fourth coil 800 are disposed on the second layer of the integrated circuit board. As demarcated by the second imaginary line L2, the second layer of the integrated circuit board is substantially divided into a third area C and a fourth area D. Each of the third area C and the fourth area D has a first side, a second side, a third side, and a fourth side. The arrangements of the four sides of the third area C or the fourth area D are the same as those in the embodiment of FIG. 2.

In this embodiment, the third coil 700 has one turn. The turn of the third coil 700 has a beginning end coupling to the second connector C4 in FIG. 4. The turn of the third coil 700 is substantially centered at the third center CC. The turn of the third coil 700 is disposed, from the second connector C4 and the second side, the third side, the first side, and the fourth side of the third area C to an end terminal 701, around the third center CC in a clockwise direction, and is then coupled to the end terminal 701. The end terminal 701 is coupled to a third port P71 disposed on the first layer in FIG. 4. The end terminal 701 is coupled to a connecting point P72 disposed on the first layer, and is then coupled to the third port P71 through a third connecting line (not shown) via the connecting point P72. The third connecting line is disposed on another layer that is different from the second layer.

In this embodiment, the fourth coil 800 has one turn. The turn of the fourth coil 800 has a beginning end coupling to the first connector C3. The turn of the fourth coil 800 is disposed, from the first connector C3 and the first side, the fourth side, the second side, and the third side of the fourth area D to an end terminal 801, around the fourth center CD in a clockwise direction, and is then coupled to the end terminal 801. The end terminal 801 is coupled to a fourth port P81 that is disposed on the first layer. The end terminal 801 is coupled a connecting point P82 disposed on the first layer, and is then coupled to the fourth port P81 through a fourth connecting line (not shown) via the connecting point P82. The fourth connecting line is disposed on another layer that is different from the second layer.

Figure 6:
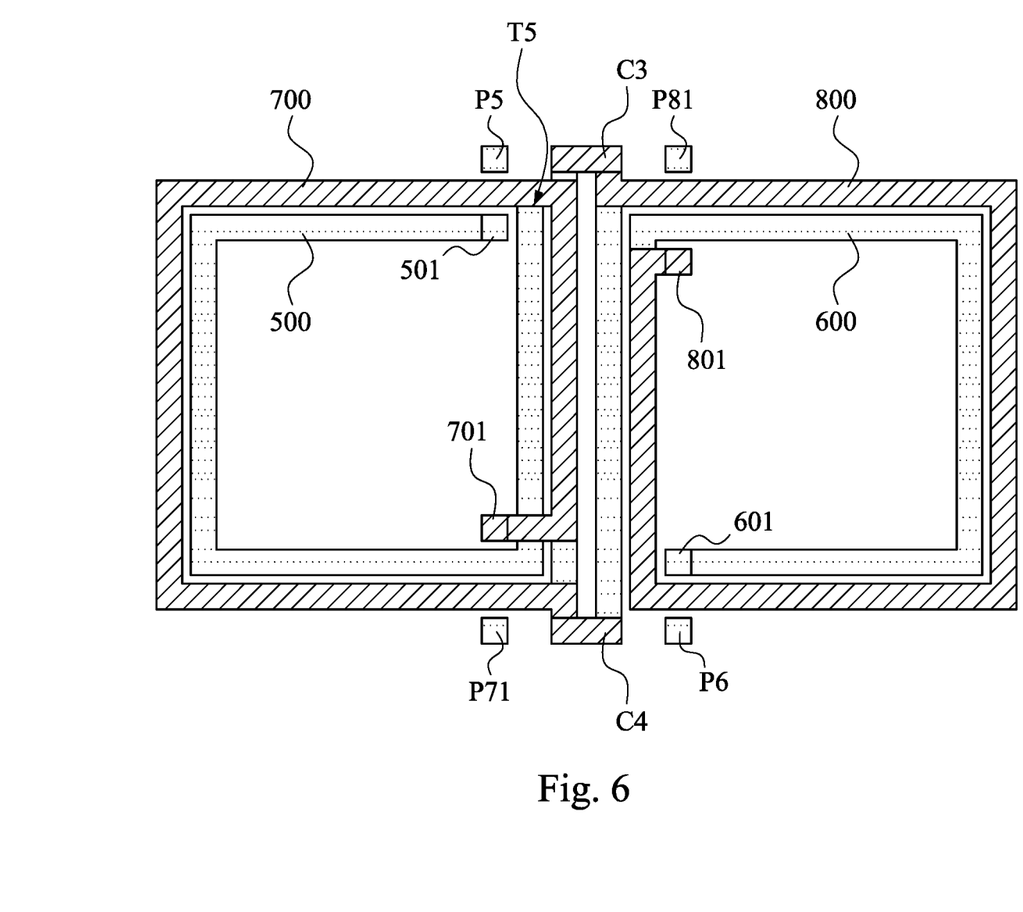
FIG. 6 is a schematic diagram of an integrated inductor apparatus according to one embodiment of present disclosure.

FIG. 6 is a schematic diagram of an integrated inductor apparatus according to one embodiment of present disclosure. The figure illustrates a stacked integrated inductor apparatus formed by the integrated inductor apparatuses shown in FIG. 4 and in FIG. 5. With respect to FIGS. 1 and 2, like elements in FIG. 6 are designated with the same reference numbers for ease of understanding. In the embodiment, the second layer of the integrated circuit board is disposed above and in parallel with the first layer. The third area C of the second layer is disposed above the first area A of the first layer, and the fourth area D of the second layer is disposed above the second area B of the first layer. In the embodiment, the first coil 500 disposed on the first layer is coupled to and interleaved with the fourth coil 800 disposed on the second layer via the first connector C3, and the second coil 600 disposed on the first layer is coupled to and interleaved with the third coil 700 disposed on the second layer via the second connector C4.

Figure 7:
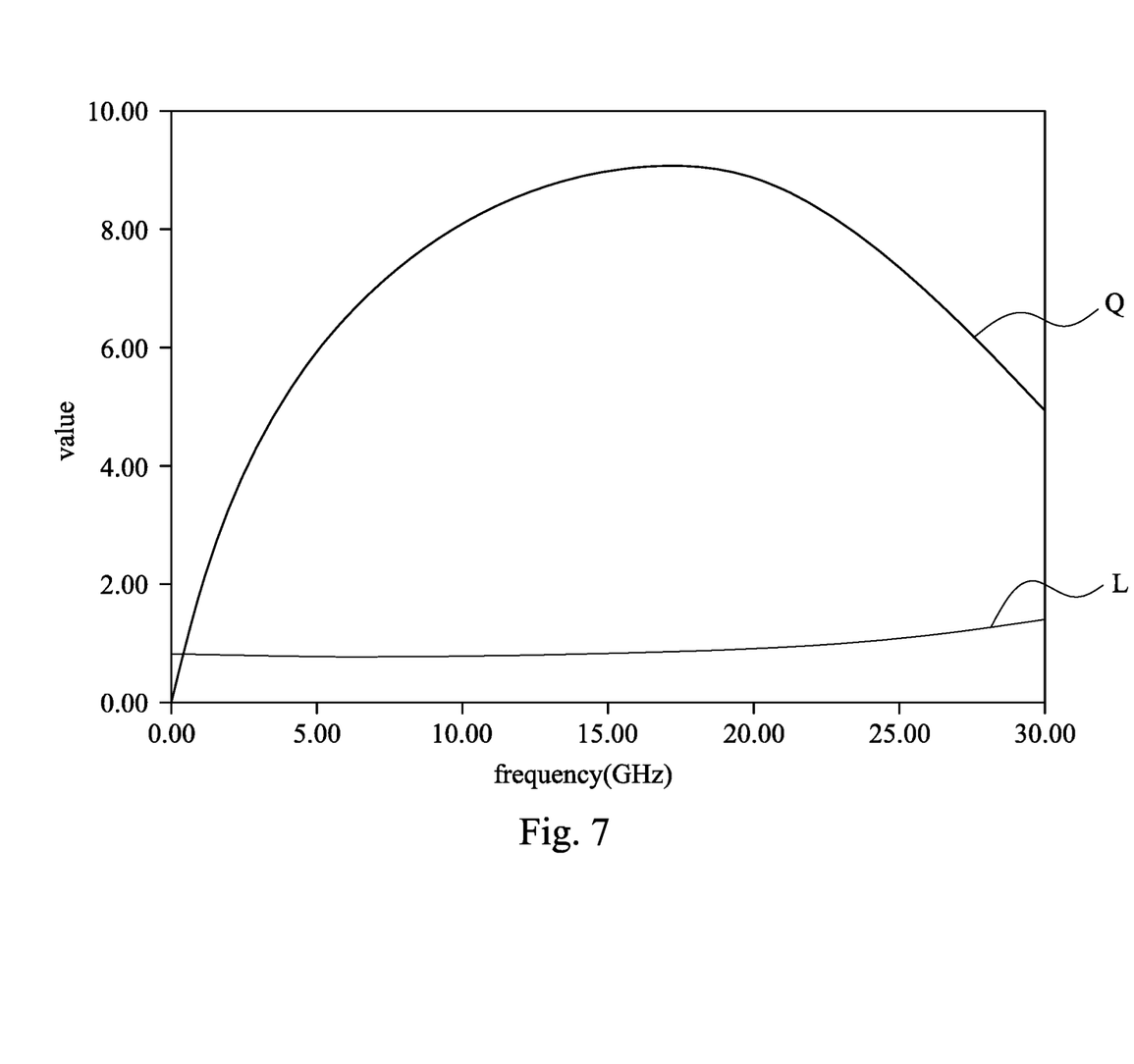
FIG. 7 is a schematic diagram shows an experiment result of an integrated inductor apparatus according to one embodiment of present disclosure.

FIG. 7 is a schematic diagram shows an experiment result of an integrated inductor apparatus according to one embodiment of present disclosure. The horizontal axis in FIG. 7 indicates a frequency. The vertical axis indicates the value of Q factors and the value of inductances. The arrangements of the integrated inductor apparatus which is measured in FIG. 7 and the windings thereof are given in the above embodiments, in which the width of each winding is about 2 μm and the length of a radius of each winding is about 25 μm. The curve Q shows the Q factor obtained from one integrated inductor apparatus in aforementioned embodiments. In fact, the curve Q is the Q factor measured from an inductor structure formed with the first coil and the fourth coil, and the Q factor measured from an inductor structure formed with the second coil and the third coil will be identical to the curve Q. As shown in FIG. 7, the Q factors of the twin inductor of the present disclose are symmetrical to each other.

With continued reference to FIG. 7, the curve L indicates the inductance value of the integrated inductor apparatus of the above embodiments. Similarly, the inductance value measured from the inductor structured formed with the first coil and the fourth coil and the inductance value measured from the second coil and the third coil are identical to the curve L. Accordingly, the Q factors and the inductance values measured from two inductor structures in the inductor apparatus of the present disclosure are very symmetric and have more symmetry than current approaches.

What is claimed is:

1. An integrated inductor apparatus, comprising:
    a first coil disposed on a first layer of an integrated circuit structure;
    a second coil disposed on the first layer and adjacent to the first coil, wherein the first coil and the second coil have identical numbers of turns;
    a third coil disposed on a second layer of the integrated circuit structure and above the first coil; and
    a fourth coil, disposed on the second layer and above the second coil, wherein the third coil and the fourth coil have identical numbers of turns;
    wherein the first coil disposed on the first layer is coupled to and interlaced with the fourth coil disposed on the second layer, and the second coil disposed on the first layer is coupled to and interlaced with the third coil disposed on the second layer, and
    wherein the first coil is connected to the fourth coil via a first connector disposed on a first orientation of the first layer, the second coil is connected to the third coil via a second connector disposed on a second orientation of the first layer, and the second orientation is opposite to the first orientation.

2. The integrated inductor apparatus of claim 1, wherein the first coil and the second coil both have two turns.

3. The integrated inductor apparatus of claim 2, wherein third coil and the fourth coil both have two turns.

4. The integrated inductor apparatus of claim 2, wherein third coil and the fourth coil both have a single turn.

5. The integrated inductor apparatus of claim 1, wherein the first connector and the second connector are both vertically disposed on the first layer and are coupled to the second layer.

6. The integrated inductor apparatus of claim 1, wherein the first coil is coupled to a first port, the second coil is coupled to a second port, the third coil is coupled to a third port, and the fourth coil is coupled to a fourth port, in which the first port and the fourth port are in electrical conduction, and the second port and the third port are in electrical conduction.

7. The integrated inductor apparatus of claim 6, wherein the first port, the second port, the third port and the fourth port are all disposed on the first layer.

8. The integrated inductor apparatus of claim 7, wherein the first port and the fourth port are disposed on the first orientation of the first layer, and the second port and the third port are disposed on the second orientation of the first layer.

9. The integrated inductor apparatus of claim 8, wherein the first coil has two turns that are outwardly wound from an end coupled to the first port to and an end coupled to the first connector in a counterclockwise direction, and the second coil has two turns that are outwardly wound from an end coupled to the second port to an end coupled to the second connector in a counterclockwise direction.

10. The integrated inductor apparatus of claim 9, wherein the third coil has two turns that are inwardly wound from an end coupled to the second connector to an end coupled to the third port in a clockwise direction, and the fourth coil has two turns that are inwardly wound from an end coupled to the first connector to an end coupled to the fourth port in a clockwise direction.

11. The integrated inductor apparatus of claim 9, wherein the third coil has a single turn that is inwardly wound from an end coupled to the second connector to an end coupled to the third port in a clockwise direction, and the fourth coil has a single turn that is inwardly wound from an end coupled to the first connector to an end coupled to the fourth port in a clockwise direction.

12. The integrated inductor apparatus of claim 1, wherein the first layer is divided, by a first imaginary line extended from the first orientation to the second orientation, into a first area and a second area, in which the first coil is disposed in the first area and the second coil is disposed in the second area, the second layer has a third area and a fourth area, the third area is above the first area, and the fourth area is above the second area, in which the third coil is disposed in the third area and the fourth coil is disposed in the fourth area, and each of the first, second, third, and fourth areas has a first side, a second side, a third side and a fourth side that are arranged in the same order.

13. The integrated inductor apparatus of claim 12, wherein the first area has a first center, the first coil is coupled to the first port at a position between the first side and the fourth side of the first area, the first coil has two turns that are outwardly wound around from the first side of the first area in a counterclockwise direction, and the first coil is coupled to the first connector at another position between the first side and the fourth side of the first area.

14. The integrated inductor apparatus of claim 13, wherein the fourth area has a fourth center, the fourth coil is coupled to the first connector at a first position between the first side and the third side of the fourth area, the fourth coil has two turns that are inwardly wound around the fourth center from the first position in a clockwise direction, and the fourth coil is coupled to the fourth port at another position between the first side and the third side of the fourth area.

15. The integrated inductor apparatus of claim 13, wherein the fourth area has a fourth center, the fourth coil is coupled to the first connector at a first position between the first side and the third side of the fourth area, the fourth coil has one turn that is outwardly wound around the fourth center from the first position in a clockwise direction, and the fourth coil is coupled to the fourth port at another position between the first side and the third side of the fourth area.

16. The integrated inductor apparatus of claim 12, wherein the second area has a second center, the second coil is coupled to a second port at the second side of the second area, the second coil has two turns that are outwardly wound around the second center from a position between the second side and the third side of the second area in a counterclockwise direction, and the second coil is coupled to the second connector at another position between the second side and the third side of the second area.

17. The integrated inductor apparatus of claim 16, wherein the third area has a third center, the third coil is coupled to the third connector at a first position between the second side and the fourth side of the third area, the third coil has two turns that are inwardly wound around the third center from the first position in a clockwise direction, and the third coil is coupled to a third port at another position between the second side and the fourth side of the third area.

18. The integrated inductor apparatus of claim 16, wherein the third area has a third center, the third coil is coupled to the third connector at a first position between the second side and the fourth side of the third area, the third coil has one turn that is inwardly wound around the third center from the first position in a clockwise direction, and the third coil is coupled to a third port being disposed at another position between the second side and the fourth side of the third area.

* * * * *